(12) United States Patent
Matsuzawa et al.

(10) Patent No.: US 7,088,607 B2
(45) Date of Patent: Aug. 8, 2006

(54) STATIC MEMORY CELL AND SRAM DEVICE

(75) Inventors: Takahiro Matsuzawa, Ibaraki (JP); Yoritaka Saitoh, Ibaraki (JP); Masayuki Hira, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 11/064,909

(22) Filed: Feb. 24, 2005

(65) Prior Publication Data

US 2005/0213415 A1    Sep. 29, 2005

(30) Foreign Application Priority Data

Mar. 23, 2004    (JP)    ............... 2004-085621

(51) Int. Cl.
*G11C 11/00*    (2006.01)
(52) U.S. Cl. ................... 365/153; 365/230.06
(58) Field of Classification Search ................ 365/154, 365/230.06, 189.09, 206
See application file for complete search history.

(56) References Cited

U.S. PATENT DOCUMENTS 6,414,895 B1 *    7/2002    Kokubo et al. .............. 365/227
6,917,538 B1 *    7/2005    Ashizawa ................... 365/154

* cited by examiner

*Primary Examiner*—Vu A. Le
(74) *Attorney, Agent, or Firm*—Jacqueline J. Garner; Wade James Brady, III; Frederick J. Telecky, Jr.

(57) ABSTRACT

The objective of this invention is to provide a static memory cell and an SRAM device that can improve the write margin while preventing degradation of the static noise margin. By turning on/off transistor Qp13, it is possible to control the drop in voltage due to the threshold voltage of transistor Qn15. For example, in read mode, when it is necessary to hold the stored data while setting word line WL to the high level, transistor Qp13 is turned off; the drivability of transistor pair Qn11, Qn12 is decreased, thereby increasing the static margin. In the case of rewriting the stored data, transistor Qp13 is turned on; the drivability of transistor pair Qn11, Qn12 is increased, thereby increasing the write margin. As a result, it is possible to improve the performance of both the static noise margin and the write margin.

20 Claims, 9 Drawing Sheets

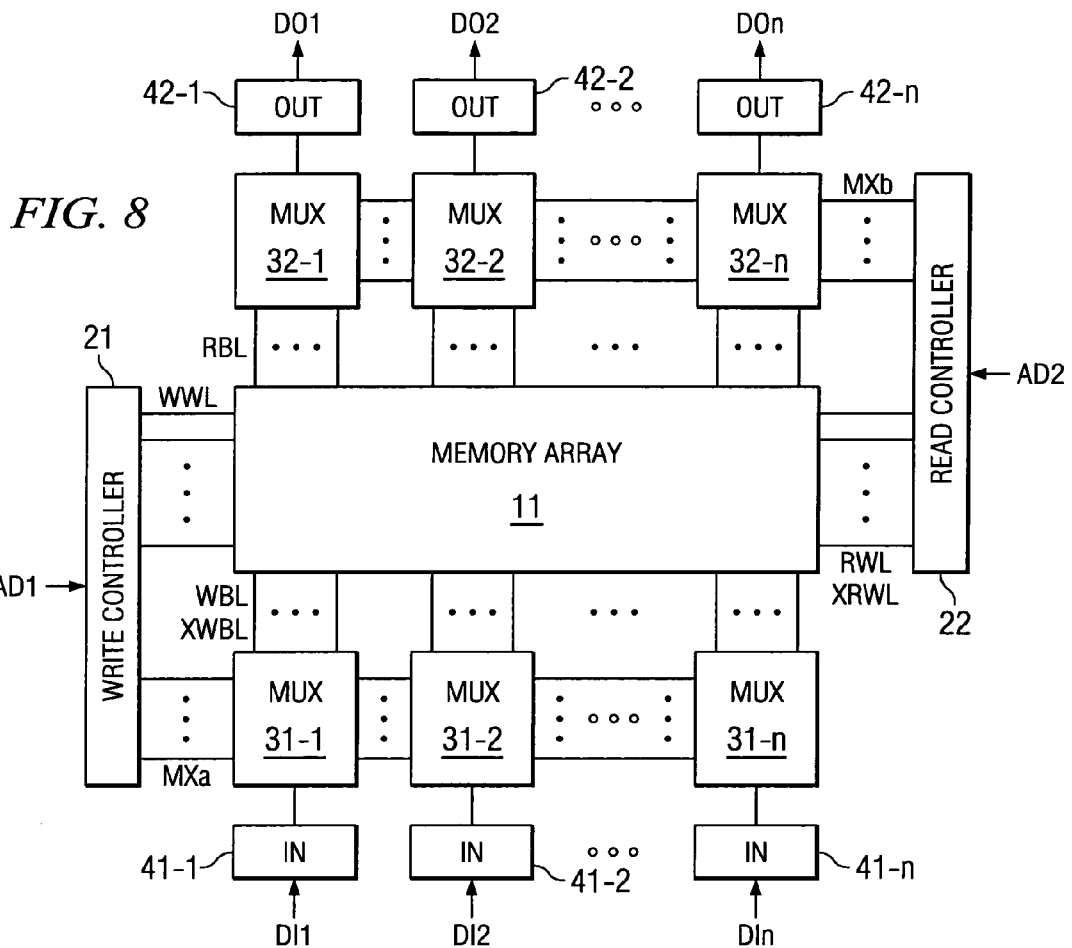

STATIC MEMORY CELL AND SRAM DEVICE

FIELD OF THE INVENTION

The present invention pertains to a memory cell and semiconductor memory device. In particular, the present invention pertains to a static memory cell and SRAM device with improved static noise margin, write margin and other properties.

BACKGROUND OF THE INVENTION

FIG. 15 is a diagram illustrating an example of the constitution of the memory cell in a general 1-port SRAM (static random-access memory). The memory cell shown in FIG. 15 has six transistors (n-type MOS transistors Qn1–Qn4, p-type MOS transistors Qp1, Qp2). Among said transistors, p-type MOS transistor Qp1 and n-type MOS transistor Qn3 form inverter circuit IV1, and p-type MOS transistor Qp2 and n-type MOS transistor Qn4 form inverter circuit IV2. The inputs and outputs of inverter circuits IV1 and IV2 are connected in the form of a ring, and the signal levels of connecting nodes N0 and N1 are held at complementary levels. That is, one node is held at the high level, while the other node is held at the low level. Due to this signal holding function, 1-bit information is stored in inverter circuits IV1 and IV2.

Node N0 is connected via n-type MOS transistor Qn1 to bit line BL. Node N1 is connected via n-type MOS transistor Qn2 to bit line XBL. The gates of n-type MOS transistors Qn1 and Qn2 are connected to word line WL, and the transistors are turned on when word line WL is at the high level and off when the word line is at the low level. When the monitored data of the memory cell is held, word line WL is set to the low level. As a result, nodes N0, N1 and bit lines BL, XBL are separated from each other, and the signal levels of nodes N are held. On the other hand, when the memory cell is to be accessed, word line WL is set to the high level. As a result, node N0, N1 are connected to bit lines BL, XBL, and, via these bit lines, data can be written to or read from the memory cell.

When data is to be written to the memory cell, the complementary signals corresponding to the write data value are output to bit line pair BL, XBL. That is, signals are output to so that one of bit lines BL, XBL is at the high level and the other is at the low level. The levels of nodes N0, N1 are set corresponding to the complementary signals. Also, when data is to be read from the memory cell, word line WL is set to the high level while bit lines BL, XBL are set to the high impedance state. As a result, the signal levels of nodes N0, N1 are displayed on bit lines BL, XBL. In this way, in the memory cell shown in FIG. 15, data write/read is performed via the common bit line pair BL, XBL.

On the other hand, in the 2-port SRAM, reading and writing are performed using independent word lines and bit lines. Consequently, it is possible to perform parallel write and read operations for memory cells having different addresses. FIG. 16 is a diagram illustrating an example of the constitution of the memory cell in a general 2-port SRAM. Like the memory cell shown in FIG. 15, the memory cell shown in FIG. 16 also has six transistors. It also has six additional transistors (n-type MOS transistors Qn5–Qn8, p-type MOS transistors Qp3, Qp4).

The connecting configuration and operation of transistors Qn1–Qn4, Qp1, Qp2 are the same as those of the memory cell shown in FIG. 15. The terminal of n-type MOS transistor Qn1 on the bit line side is connected via n-type MOS transistor Qn5 to ground G. The bit-line-side terminal of n-type MOS transistor Qn2 is connected via n-type MOS transistor Qn6 to ground G. Write bit line WBL is connected to the gate of n-type MOS transistor Qn5, and write bit line XWBL is connected to the gate of n-type MOS transistor Qn6. Also, the gates of transistors Qn1 and Qn2 are connected to write word line WWL. Transistors Qn7, Qn8, Qp3, Qp4 form a circuit for outputting the memory data to read bit line RBL. N-type MOS transistor Qn7 and p-type MOS transistor Qp3 form inverter circuit IV3. Inverter circuit IV3 inverts the signal of node N1 and outputs it to read bit line RBL. N-type MOS transistor Qn8 is inserted between said inverter circuit IV3 and ground G. P-type MOS transistor Qp4 is inserted between inverter circuit IV3 and power source line Vcc. The gate of n-type MOS transistor Qn8 is connected to read word line RWL, and the gate of p-type MOS transistor Qp4 is connected to read word line XRWL. Said n-type MOS transistor Qn8 and p-type MOS transistor Qp4 are both turned on or off corresponding to the complementary signals input to the read word line pair (RWL, XRWL).

When data is written to the memory cell shown in FIG. 16, the complementary write signal is supplied to the write bit line pair WBL, XWBL while write word line WWL is set to the high level. Corresponding to said write signal, one of n-type MOS transistors Qn5 and Qn6 is turned on, and, via the on transistor, node N0 or N1 is pulled down to the zero level. In this way, the levels for node N0 and N1 are set corresponding to the write signal.

On the other hand, when data is to be read from the memory cell, read word line RWL is set to the high level, while read word line XRWL is set to the low level. As a result, both n-type MOS transistor Qn8 and p-type MOS transistor Qp4 are turned on, and inverter circuit IV3 works and outputs NOT signal of node N1 to read bit line RBL.

In the memory cell design, the most important factors to consider are guaranteeing both "writing facility" and "stored data stability." The first property is known as write margin (hereafter referred to as WM), and the second property is known as static noise margin (hereafter referred to as SNM). As will be explained below, these properties contradict each other. That is, enhancing one requires sacrificing the other, which is undesirable.

FIG. 17 illustrates the operation when the stored data in the memory cell shown in FIG. 15 is damaged. FIG. 17(A) shows the state in which n-type MOS transistors Qn1 and Qn2 are turned on while bit lines BL, XBL are precharged. FIG. 17(B) shows the voltage waveforms of the various portions in this case. Usually, in data read mode, the bit line is precharged to the high level. Also, in data write mode, the bit lines connected to the memory cells that are not write objects are precharged to the high level. As shown in FIG. 17(A), when n-type MOS transistors Qn1 and Qn2 are turned on while the bit line is precharged, current flows into the node at the low level from the bit line, and the voltage of this node rises.

In the example shown in FIG. 17, during a normal read operation, as the voltage on word line WL (curve C1) changes to the high level, and n-type MOS transistors Qn1 and Qn2 are turned on, although there is a certain rise in the voltage of node N1 (curve C4) held at the low level, it does not reach the state of level inversion, and the voltage of node N2 (curve C2) is held at the high level. Consequently, after n-type MOS transistors Qn1 and Qn2 return to the off state, node N0 goes to the high level, and node N1 goes to the low level.

In the example shown in FIG. 17, when data damage takes place, as n-type MOS transistors Qn1 and Qn2 are turned on, along with the rise in voltage at node N1 (curve C5), the logic of inverter IV1 is inverted, and the voltage at node N2 (curve C3) decreases. As a result, when word line WL returns to the low level, node N0 goes to the low level, and node N1 goes to the high level. Thus, in order to increase the SNM such that it is difficult for said data damage to take place, within the range of meeting the specification for the data read access time, it is preferred that the drivability of n-type MOS transistors Qn1 and Qn2 be as low as possible, and that the current sourced by the bit line be low.

FIG. 18 illustrates a data write failure to the memory cell shown in FIG. 15. FIG. 18(A) illustrates the state in which n-type MOS transistors Qn1 and Qn2 are turned on when the write signal has been input to bit lines BL, XBL. FIG. 18(B) illustrates the voltage waveforms of the various portions in this case. In the example shown in FIG. 18, during a normal write operation, as n-type MOS transistors Qn1 and Qn2 are turned on, the voltage at node N0 (curve C7) held at the high level is pulled down by the low level voltage of bit line BL, while the voltage at node N1 (curve C9) held at the low level is pulled up by the high level voltage of bit line XBL. Due to these voltage changes, a level inversion takes place, so that node N0 goes to the low level, and node N1 goes to the high level. In the example shown in FIG. 18, when a data write defect takes place, the decrease in the voltage of node N0 (curve C8) and the rise in the voltage of node N1 (curve C10) are insufficient. Consequently, no level inversion takes place during the on period of n-type MOS transistors Qn1 and Qn2. Thus, the rewrite operation of node N0 and N1 is performed in the same way as described above.

In order to increase the WM so that it is difficult for said write defect to take place, it is preferred that the drivability of n-type MOS transistors Qn1 and Qn2 be increased as much as possible, and the current from the bit line be as high as possible. Consequently, when the drivability of n-type MOS transistors Qn1 and Qn2 is decreased to improve the SNM, the WM deteriorates. On the other hand, when the drivability of said transistors is increased to improve the WM, the SNM deteriorates. That is, the SNM and WM contradict one another. Consequently, when designing memory, it is necessary to adjust the size, etc. of n-type MOS transistors Qn1 and Qn2 and other transistors so that the required specifications for both are met.

However, in recent years, with progress in processing technology for low power, low-threshold transistors, it has become difficult to meet these contradictory requirements for the SNM and WM at the same time by this means of adjusting the size of transistors, etc. On the other hand, in the 2-port type memory cell shown in FIG. 16, inverter circuit IV3 is used for reading data so that the read bit line and memory nodes N0, N1 are not directly connected to each other. Also, for the memory cell that is not the write object during the data write operation (when word line WWL is at the high level), write bit lines WBL and XWBL are set to the low level. Consequently, both n-type MOS transistors Qn5 and Qn6 are turned on, and little current flows into node N0 and N1. Consequently, in terms of the SNM, the 2-port type memory cell shown in FIG. 16 is better than the 1-port type memory cell shown in FIG. 15. However, in the memory cell shown in FIG. 16, when a write is to be performed, only the node on one side is pulled down to the low level, while the other node is set to the high impedance state. Consequently, compared with the scheme shown in FIG. 15 in which both nodes N0 and N1 can be driven, the memory cell shown in FIG. 16 has a low ability to be written to, so that the WM performance deteriorates. Also, the current for pulling down the potential of node N0 and N1 to the low level flows through 2-stage tandem-connected transistors Qn1 and Qn5, Qn2 and Qn6 to ground G. Consequently, this point also leads to degradation in WM performance. In particular, when the power voltage and transistor threshold further decrease in the future, the impedance of the tandem-connected transistors will significantly further decrease the drivability.

The purpose of the present invention is to solve the problems of the prior art by providing a static memory cell that can suppress the degradation of the SNM and improve the WM, and an SRAM device containing said memory cells in order to improve the reliability.

SUMMARY OF THE INVENTION

The first portion of the present invention provides a static memory cell characterized by the following facts: the static memory cell comprises a memory circuit, in which the signal levels of the memory node pair are held at complementary levels, and in which the signal levels of said memory node pair are inverted for inputting complementary signals, as well as a transistor pair that can be turned on/off corresponding to the input first control signal; and a level conversion circuit that changes the level of said first control signal input to said transistor pair to the level with the lower drivability of said transistor pair corresponding to the input level control signal.

According to the first portion of the present invention, the level of said first control signal input to said transistor pair is changed corresponding to the level control signal, and the drivability of the transistor pair decreases. Consequently, when it is necessary to hold the stored data while said transistor pair is turned on (for example, when data is read via said first bit line pair, or when said transistor pair is turned on while the memory cell is not a write object) and when said transistor pair is turned on and rewriting of the stored data is performed, it is possible to set the drivability of said transistor pair appropriately in accordance with each case. Also, because the stored data of said memory circuit is rewritten as said complementary signals drive said memory node pair, compared with the case when only one of said memory node pair is driven, the rewrite performance of said memory circuit can be improved.

In a preferred method, said level conversion circuit has a switch circuit that turns on/off corresponding to said level control signal; and a transistor circuit that is connected in parallel with said switch circuit and, when said switch circuit is off, changes the level of said first control signal input to one terminal of said switch circuit by a prescribed threshold level, and outputs it from the other terminal of said switch circuit. In this case, said transistor pair contains a transistor of the first conductivity type, said switch circuit contains a transistor of the second conductivity type, and said transistor circuit contains a transistor of the first conductivity type connected in parallel to the transistor of the second conductivity type of said switch circuit.

The second portion of the present invention provides a static random-access memory cell characterized by the fact that it comprises plural memory cells arranged in an array, plural word lines each connected to memory cells of the same row, plural bit line pairs each connected to the memory cells of the same column, and a controller that outputs a control signal for accessing said memory cell to said word line, and, at the same time, generates a level control signal for controlling the level of said control signal input to said memory cell; wherein said memory cells comprise a memory circuit that holds the signal levels of said memory node pair at complementary levels and inverts the signal levels of said memory node pair corresponding to the complementary signals input through said bit line pair, a transistor pair that is connected between said bit line pair and said memory node pair and is turned on/off corresponding to the level of said control signal input through said word line, and a level conversion circuit that changes the level of said control signal input to said transistor pair to the level with a lower drivability of said transistor pair. In a preferred method, said controller generates said level control signal by executing said level conversion for said control signal input to the memory cells that are not write objects but are contained in the same row as the memory cell that is the write object and/or all of the memory cells contained in the same row as the memory cell as the read object.

According to the second portion of the present invention, in the memory cells that are not the write objects but are contained in the same row as the memory cell that is the write object and all of the memory cells contained in the same row as the memory cell as the read object, the level of said first control signal input to the transistor pair is changed by said level conversion circuit, and the drivability of said transistor pair decreases.

The third portion of the present invention provides a static random-access memory device characterized by the fact that it comprises the following parts: plural memory cells arranged in an array, plural first word lines each connected to the memory cells in the same row, plural second word lines each connected to the memory cells in the same row, plural first bit line pairs each connected to the memory cells in the same column, plural second bit lines each connected to the memory cells in the same column; a first controller that outputs a first control signal for writing data in said memory cell to said first word line and, at the same time, generates a selection signal for selecting the memory cell of the write object from the memory cells connected to the same word line, and a second controller that outputs a second control signal for reading data from said memory cell to said second word line; wherein said memory cell comprises the following parts: a memory circuit that holds the signal levels of the memory node pair at complementary levels and inverts the signal levels of said memory node pair corresponding to the complementary signals input through said first bit line pair, a transistor pair that is connected between said first bit line pair and said memory node pair and is turned on/off corresponding to the level of said first control signal input through said first word line, a read circuit that outputs a read signal, which corresponds to the signal of at least one node of said memory node pair, to said second bit line corresponding to the second control signal input through said second word line, and a level conversion circuit that changes the level of the first control signal input to said transistor pair to a level with lower drivability of the transistor pair when not selected as the write object by said selection signal.

According to said third portion of the present invention, during the data write operation, the first control signal for writing data to a given memory cell is output to said first write line, and at the same time, a selection signal that selects the memory cell as the write object from among the memory cells connected to the same word line is generated. In those memory cells not selected as write objects by said selection signal, the level of said first control signal input to the transistor pair is changed, and the drivability of the transistor pair decreases.

The fourth portion of the present invention provides a static random-access memory device characterized by the fact that it comprises plural memory cells arranged in an array, plural first word lines each connected to the memory cells in the same row, plural second word lines each connected to the memory cells in the same row, plural first bit line pairs each connected to the memory cells in the same column, plural second bit lines each connected to the memory cells in the same column; a first controller that outputs the first control signal for writing data in said memory cell to said first word line and, at the same time, generates a selection signal for selecting the memory cell of the write object from the memory cells connected to the same word line; plural level conversion circuits corresponding to the plural memory cell groups that can become write objects by means of said selection signal, and a second controller that outputs the second control signal for reading data from said memory cell to said second word line. Said memory cell comprises the following parts: a memory circuit that holds the signal level of the memory node pair at complementary levels and inverts the signal level of said memory node pair corresponding to the complementary signals input through said first bit line pair, a transistor pair that is connected between said first bit line pair and said memory node pair and is turned on/off corresponding to the level of said first control signal input through said first word line, and a read circuit that outputs a read signal, which corresponds to the signal of at least one node of said memory node pair, to said second bit line corresponding to the second control signal input through said second word line. Said level conversion circuit changes the level of the first control signal input to said transistor pair of the corresponding memory cell group to a level with lower drivability for said transistor pair when said corresponding memory cell group is not selected as the write object by said selection signal.

According to the fourth portion of the present invention, in data write mode, the first control signal for writing data to said memory cell is output to said first write line, and at the same time, a selection signal for selecting the memory cell as the write object from the memory cells connected to the same word line is generated. In those memory cell groups not selected as write objects by said selection signal, the level of said first control signal input to the transistor pair is changed, and the drivability of the transistor pair decreases.

BRIEF DESCRIPTION OF THE DRAWINGS

FIG. 8 is a diagram illustrating an example of the constitution of the SRAM device of Embodiment 2.

FIG. 9 is a diagram illustrating an example of the constitution of the memory cell of Embodiment 2.

REFERENCE NUMERALS AND SYMBOLS AS SHOWN IN THE DRAWINGS

Figure 10:
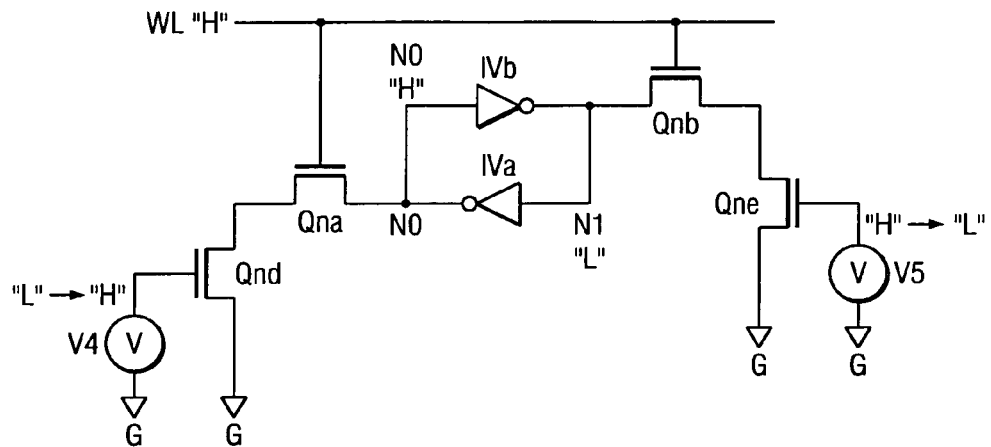
FIG. 10 is a diagram illustrating the circuit for simulating the performance of the WM of the memory cell shown in FIG. 9.
Figure 11:
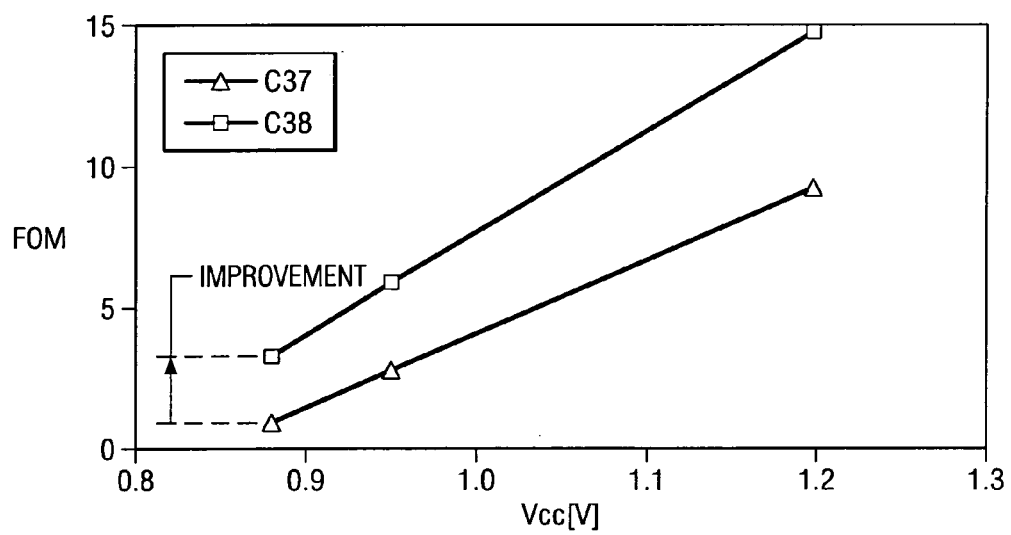
FIG. 11 is a diagram illustrating the results of simulating the performance of WM of the memory cell shown in FIG. 9.

In the FIGS. 10, 11, 11A represent memory arrays, 20 a controller, 21 a write controller, 22 a read controller, 30-1 to 30-n, 31-1 to 31-n, 32-1 to 32-n column selecting circuits, 40-1 to 40-n input/output circuits, 41-1 to 41-n input circuits, 42-1 to 42-n output circuits, 51, 52 channel wirings, Qn1 to Qn17 n-type MOS transistors, and Qp1 to Qp15 p-type MOS transistors.

DESCRIPTION OF THE EMBODIMENTS

According to the present invention, it is possible to suppress the degradation of the SNM and to improve the WM. As a result, it is possible to improve the reliability. Three embodiments of the present invention will be explained below with reference to the attached figures.

Embodiment 1

Figure 1:
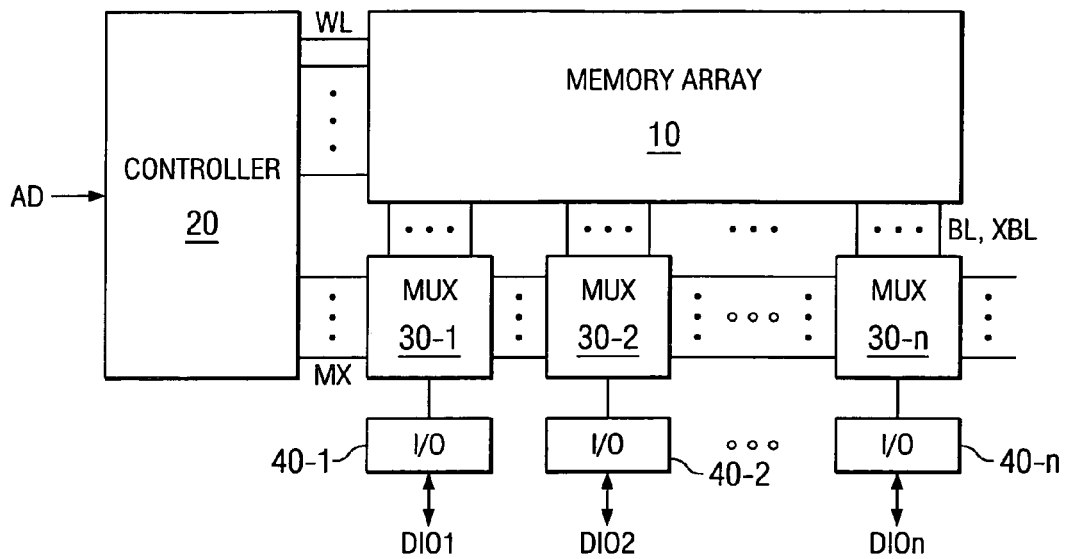
FIG. 1 is a diagram illustrating an example of the constitution of the SRAM device of Embodiment 1.

FIG. 1 is a diagram illustrating an example of the constitution of the SRAM device of Embodiment 1 of the present invention. The SRAM device shown in FIG. 1 comprises memory array 10, controller 20, column selecting circuits 30-1 to 30-n (where n is a natural number), and input/output circuits 40-1 to 40-n. Controller 20 shows an embodiment of the controller of the present invention. Memory array 10 contains plural memory cells arranged in an array. The memory cells that are arranged side by side in the same row are connected to the common word line WL, and the memory cells that are arranged side by side in the same column are connected to the common bit line pair BL, XBL. Also, among said plural memory cells, the memory cells arranged side by side in the same column are connected to common level control line LL. Level signal line LL is a signal line that transmits the control signal for level conversion (level control signal) to be explained below.

Among plural word lines WL of memory array 10, controller 20 enables one word line WL corresponding to the address signal AD. Also, from the plural column selecting lines MX (to be explained below), one column selecting line MX selected corresponding to address signal AD is enabled. Then, it generates various control signals for performing data read/write that can be accessed corresponding to said enabled signal lines. For example, in the case of a data write operation, controller 20 enables level control line LL of the column as the write object corresponding to enabled column selecting line MX, and disables level control lines LL of the other columns that are not objects of the write operation. As a result, in the row of the memory cells connected to enabled word line WL, the level conversion (to be explained below) is performed for the memory cells that are not objects of a write operation. In the case of a data read operation, controller 20 disables all of level control lines LL. As a result, the level conversion (to be explained below) is performed for all of the memory cells of the row connected to enabled word line WL.

Column selecting circuits 30-1 to 30-n are circuits for selecting one row as the access object from the memory cells of k columns (where k is a natural number). That is, column selecting circuits 30-1 to 30-n are connected to k common column selecting lines MX, and at the same time are connected to k groups of bit line pairs BL, XBL. Since one of k column selecting lines MX is enabled by controller 20, one the bit line pair BL, XBL corresponding to the enabled column selecting line MX is selected from k groups. Then, in data write, amplification and other processes are performed on the write signals input from input/output circuits 40-1 to 40-n. The result is output to the selected bit line pair BL, XBL. Also, in data read mode, amplification and other processes are performed on the read signal of said selected bit line pair BL, XBL, and the result is output to input/output circuits 40-1 to 40-n. In input/output circuits 40-1 to 40-n, in data write mode, the write signal input from the external terminal is amplified and output to column selecting circuits 30-1 to 30-n. Also, in data read mode, the read signal output from column selecting circuits 30-1 to 30-n is amplified and output to the external terminal.

Figure 2:
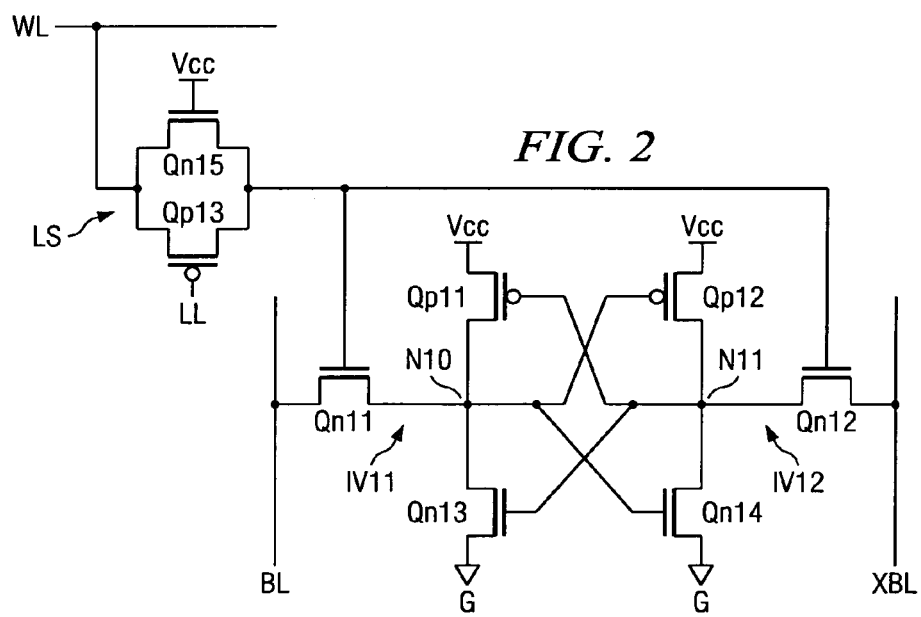
FIG. 2 is a diagram illustrating an example of the constitution of the memory cell of Embodiment 1.

The detailed configuration of the memory cell contained in memory array 10 will be explained below with reference to FIG. 2. FIG. 2 is a diagram illustrating an example of the constitution of the memory cell in the present embodiment and contained in memory array 10. The memory cell shown in FIG. 2 has n-type MOS transistors Qn11-Qn15 and p-type MOS transistors Qp11-Qp13. The circuit containing n-type MOS transistors Qn13, Qn14 and n-type MOS transistors Qn11, Qp12 is an embodiment of the memory circuit of the present invention. N-type MOS transistors Qn11 and Qn12 are an embodiment of the transistor pair of the present invention. N-type MOS transistor Qn15 and p-type MOS transistor Qp13 are an embodiment of the level conversion circuit of the present invention. N-type MOS transistor Qn15 is an embodiment of the transistor circuit of the present invention. P-type MOS transistor Qp13 is an embodiment of the switch circuit of the present invention. N-type MOS transistor Qn13 and p-type MOS transistor Qp11 form inverter circuit IV11. That is, n-type MOS transistor Qn13 is connected between node N10 and ground G, and p-type MOS transistor Qp11 is connected between power source Vcc and node N10. The gates of said two transistors are connected in common to node N11. N-type MOS transistor Qn14 and p-type MOS transistor Qp12 form inverter circuit IV12. That is, n-type MOS transistor Qn14 is connected between node N11 and ground G, and p-type MOS transistor Qp12 is connected between power source Vcc and node N11. The gates of the two transistors are common connected to node N10. The inputs and outputs of said two inverter circuits IV11, IV12 are connected to each other in a ring configuration to form a memory circuit, and the signal levels of the memory node pair N10, N11 are held at complementary levels. Node N10 is connected via n-type MOS transistor Qn11 to bit line BL. Node N11 is connected via n-type MOS transistor Qn12 to bit line XBL. The gates of n-type MOS transistors Qn11 and Qn12 are connected via level conversion circuit LS (to be explained below) to word line WL. N-type MOS transistor Qn15 and p-type MOS transistor Qp13 form level conversion circuit LS. N-type MOS transistor Qn15 and p-type MOS transistor Qp13 are connected in parallel. The gate of n-type MOS transistor Qn15 is connected to power source Vcc, and the gate of p-type MOS transistor Qp13 is connected to level control line LL.

The operation of the SRAM device of the present embodiment with the aforementioned constitution will be explained below for the case of data write and data read operations, respectively.

Data Write Operation

In the data write operation, by means of controller 20, one of word lines WL and one of column selecting lines MX are enabled corresponding to address signal AD. Also, level control line LL of the column as the write object corresponding to said enabled column selecting line MX is enabled, and level control line LL of the columns not as the object of write is disabled.

In the memory cell to be written to, when the level is high when word line WL is enabled and the level is low when level control line LL is enabled, level control LL goes to the low level, so that p-type MOs transistor Qp13 is on. Then, the high level voltage applied to word line WL is input via said on p-type MOS transistor Qp13 to the gates of n-type MOS transistors Qn11 and Qn12. If the high level voltage is equal to the power source voltage, the gates of n-type MOS transistors Qn11 and Qn12 are also at the power source voltage. As a result, n-type MOS transistors Qn11 and Qn12 are turned on, and memory node pair N10, N11 and bit line pair BL, XBL are connected to each other. In this case, after the write signal input via input/output circuits 40-1 to 40-n is amplified and converted to a complementary signal by means of column selecting circuits 30-1 to 30-n, it is output to the bit line pairs BL, XBL corresponding to the enabled column selecting line MX. As a result, the memory cell as the write object holds the stored data corresponding to the input write signal.

On the other hand, in the memory cell that is not the object of a write with word line WL set to the high level and level control line LL set to the low level, because p-type MOS transistor Qp13 is off, the high level signal supplied to word line WL is input via n-type MOS transistor Qn15 to n-type MOS transistors Qn11 and Qn12. In order to turn on n-type MOS transistor Qn15, at least a voltage greater than the threshold voltage of the transistor should be applied across the gate and source. Consequently, even when word line WL is at the high level voltage near the power source voltage, the source-side voltage of n-type MOS transistor Qn15 is at a voltage below said high level voltage by an amount equal to the threshold voltage. Consequently, the gate voltage of n-type MOS transistors Qn11 and Qn12 will be lower than that of said memory cell to be written to, so that said transistors have reduced drivability.

In this case, the bit line pair BL, XBL is precharged to the high level on the basis of control by controller 20. Consequently, a high level voltage is applied via n-type MOS transistors Qn11 and Qn12 to the memory node pair N10, N11 of the memory cell that is not the object of a write operation. However, as explained above, when the drivability of n-type MOS transistors Qn11 and Qn12 is reduced, the current flowing from bit line pair BL, XBL to memory node pair N10, N11 becomes smaller, and the danger of inversion of the monitored data becomes lower.

Data Read Mode

When data read is performed, by means of controller 20, word line WL and column selecting line MX are enabled one by one corresponding to address signal AD, and, at the same time, level conversion lines LL of all of the columns are disabled. Consequently, in this case, all of the memory cells for which word line WL goes to the high level have the same state as that of said memory cell that is not the object of a write, and the signal input to the gates of n-type MOS transistors Qn11 and Qn12 goes to the low level, and its drivability becomes lower.

In the data read mode, bit line pair BL, XBL are precharged to the high level, and, as explained above, the drivability of n-type MOS transistors Qn11 and Qn12 is lower, and the danger of inversion of the stored data is reduced.

As explained above, for the SRAM device of the present embodiment, in the memory cells that are not objects of a write but are contained in the same row as the memory cell that is the object of a write and all of the memory cells contained in the same row as the memory cell that is the object of a read, the level of the signal input to the gates of transistor pair (Qn11, Qn12) is subject to level conversion so that the level decreases by a voltage corresponding to the threshold of the transistor, and the drivability of transistor pair Qn11, Qn12 is reduced. Consequently, when it is necessary to hold the stored data while transistor pair Qn11, Qn12 is turned on, the drivability of transistor pair Qn11, Qn12 decreases, the SNM rises, and when rewriting of the stored data is performed, it is possible to increase the drivability of transistor pair Qn11, Qn12 and to improve the WM. As a result, it is possible to improve the performance of both the SNM and WM, which was difficult to realize in the prior art, and it is possible to improve the reliability of the device. Also, as the complementary signals at the high level and low level transmitted through bit line pair BL, XBL are input via transistor pair Qn11, Qn12 to memory node pair N10, N11, rewriting of stored data is performed. Consequently, compared with the system in which only the memory node on one side is driven as in the memory cell shown in FIG. 16, it is possible to improve the WM. Also, because level conversion circuit LS is inserted between word line WL and transistor pair Qn11, Qn12, the isolation of word line WL and transistor pair Qn11, Qn12 increases due to the resistive component of the level conversion circuit. Consequently, the influence of noise from word line WL is negligible, and the occurrence of resulting errors can be reduced.

Simulation Result 1

The results of analysis of the performance pertaining to the memory cell shown in FIG. 2 and the SNM and WM of the memory cell shown in FIG. 15 by means of simulation will be explained below.

Figure 3A:
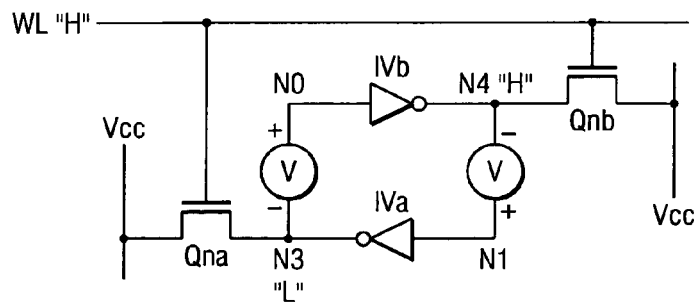
FIG. 3 is a diagram illustrating the circuit for simulating the performance of the static noise margin SNM of the memory cell shown in FIG. 2.
Figure 15:
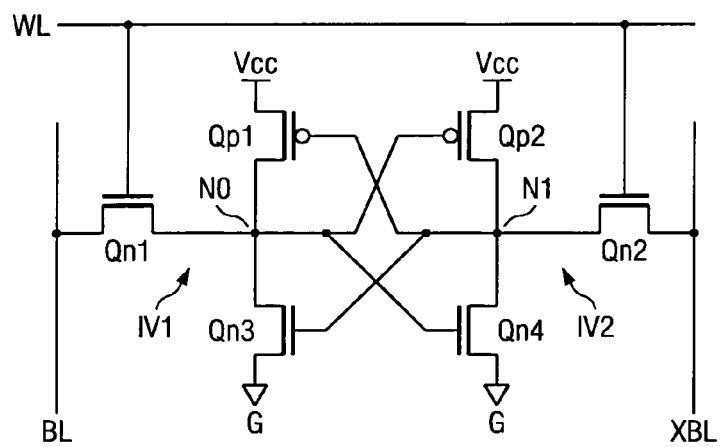
FIG. 15 is a diagram illustrating an example of the constitution of the memory cell in 1-port type SRAM.

FIG. 3(A) is a diagram illustrating the circuit used to simulate the performance pertaining to said SNM of the conventional memory cell shown in FIG. 15. In FIG. 3(A), n-type MOS transistors Qna, Qnb and inverter circuits IVa, IVb correspond to n-type MOS transistors Qn1, Qn2 and inverter circuits IV1, IV2 shown in FIG. 15, respectively. In the circuit shown in FIG. 3(A), bit line pair BL, XBL and word line WL are fixed at the high level. Also, in the initial state, the output of inverter circuit IVa is set to the low level, while the output of inverter circuit IVb is set to the high level. Then, adjustable voltage V, with one polarity and the potential of node N0 higher than that of node N3, is applied between connecting node N3, between inverter IVa and n-type MOS transistor Qna, and input node N0 of inverter IVb. Also, adjustable voltage V, with the opposite polarity and the potential of node N1 higher than that of node N4, is applied between connecting node N4, between inverter IVb and n-type MOS transistor Qnb, and input node N1 of inverter IVb.

Figure 3B:
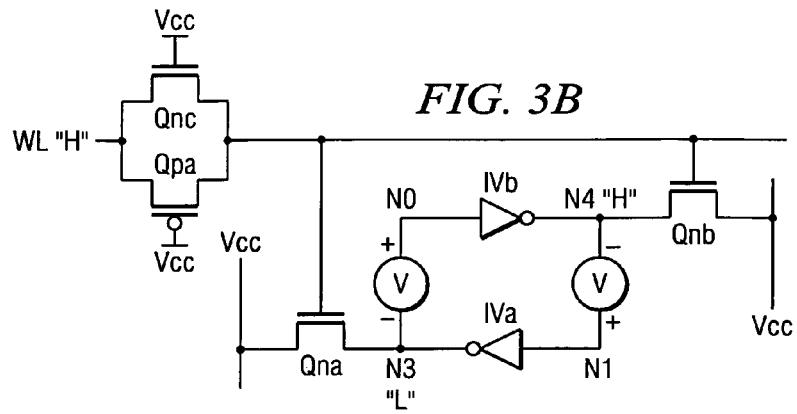
Figure 3C:
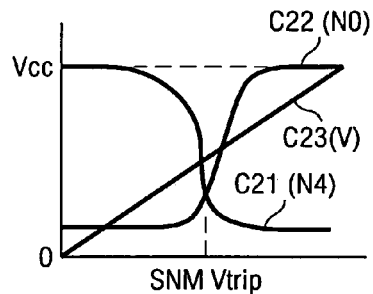

As indicated by straight line C23 in FIG. 3(C), when said adjustable voltage V is swept from zero to the power source voltage, the voltage of node N4 (curve C21) decreases from the high level, the voltage of node N0 (curve C22) rises from the low level, and the two voltages become equal to each other at certain time. The voltage at which the two voltages are equal is defined as voltage Vtrip_SNM pertaining to the performance of the SNM.

Also, FIG. 3(B) is a diagram illustrating the circuit for simulating the performance pertaining to the SNM for the memory cell pertaining to the present embodiment shown in FIG. 2. In FIG. 3(B), n-type MOS transistors Qna, Qnb, Qnc, p-type MOS transistor Qpa, and inverter circuits IVa, IVb correspond to n-type MOS transistors Qn11, Qn12, Qn15, p-type MOS transistor Qp13 and inverter circuits IV11, IV12 shown in FIG. 2, respectively.

In the circuit shown in FIG. 3(B), simulation is performed under the same conditions as in FIG. 3(A), except that a high level voltage is applied to the gates of n-type MOS transistor Qnc and p-type MOS transistor Qpa. As a result, in the circuit shown in FIG. 3(B), voltage Vtrip_SNM is also obtained.

Figure 4A:
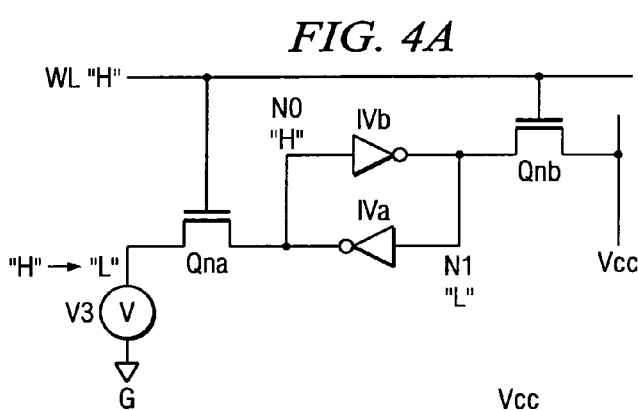
FIG. 4 is a diagram illustrating the circuit used for simulating the performance of the write margin WM of the memory cell shown in FIG. 2.

On the other hand, FIG. 4(A) shows the circuit for simulating the performance concerning WM for the conventional memory cell shown in FIG. 15. The same part numbers as those that appear in FIG. 3(A) are used. As shown in FIG. 4(A), in the simulation of WM, bit line XBL and word line WL are fixed to the high level, and adjustable voltage V is applied to bit line BL. Also, in the initial state, the output of inverter circuit IVa is set to the high level, and the output of inverter circuit IVb is set to the low level.

As indicated by straight line C26 in FIG. 3(C), when said adjustable voltage V is swept from zero to the power source voltage, the voltage of node N0 (curve C24) falls from the high level, and, at the same time, the voltage of node N1 (curve C25) rises from the low level. The two voltages become equal to each other at certain time, and the voltage at which the two voltages are equal is defined as voltage Vtrip_WM pertaining to the performance of the WM.

Figure 4B:
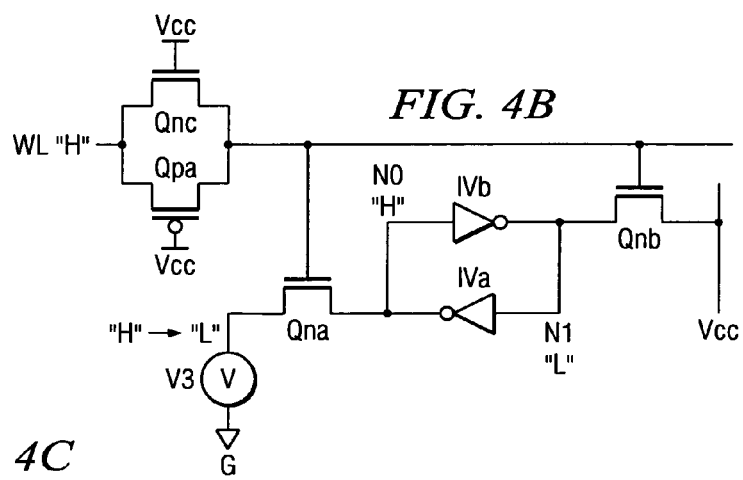
Figure 4C:
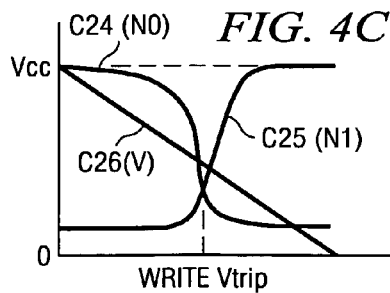

FIG. 4(B) is a diagram illustrating the circuit used for simulating the performance concerning WM for the memory cell of the present embodiment shown in FIG. 2. The same part numbers as those that appear in FIG. 4(B) are used. In the circuit shown in FIG. 4(B), simulation is performed under the same conditions as in FIG. 4(A), except that a high level voltage is applied to the gates of n-type MOS transistor Qnc and p-type MOS transistor Qpa. As a result, in the circuit shown in FIG. 4(B), voltage Vtrip_WM is also obtained. Said voltages Vtrip_SNM and Vtrip_WM are simulated over a wide range of manufacturing lot units and wafer units, and they are also simulated over a narrow range within one memory chip. Average value AVg and standard deviation σg of the voltage obtained in the wide-range simulation and standard deviation σc of the voltage obtained in the narrow-range simulation are used to compute the characteristic known as the FOM (figure of merit) using the following formula.

(FOM of SNM)=(AVg−3σg)/σc    (1);

(FOM of WM)=(AVg−3σg−0.1[VJ])/σc    (2);

The FOM is a numerical index for the performance of the SNM and WM; the larger the value, the better the performance.

Figure 5:
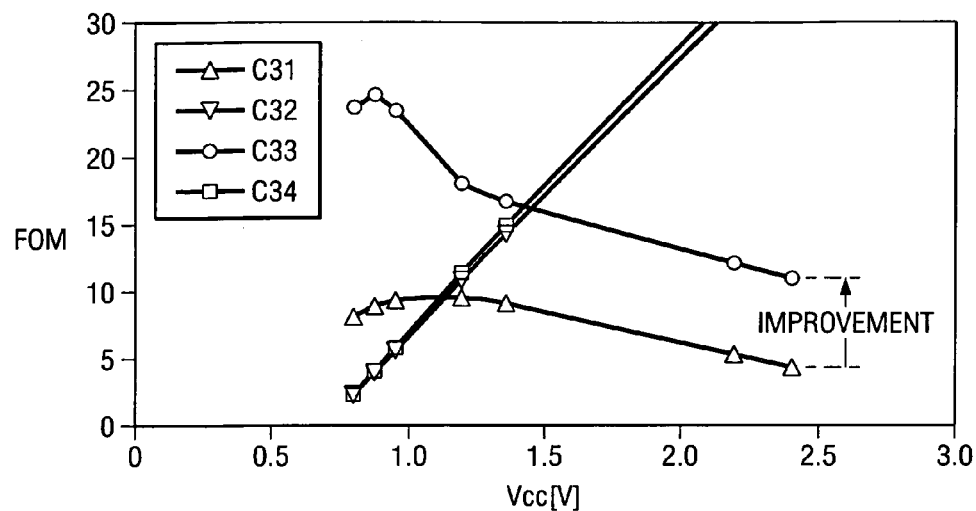
FIG. 5 is the first diagram illustrating the results of simulating the performance of the SNM and WM of the memory cell shown in FIG. 2.

FIG. 5 is a diagram illustrating the results of the plural power source voltages computed for the memory cells in FIGS. 15 and 2 for the SNM and WM computed as described above. The abscissa represents the power supply voltage, and the ordinance the value of FOM. Curve C31 shows the FOM of the SNM of the conventional memory cell (FIG. 15). Curve C32 shows the FOM of the WM of the conventional memory cell (FIG. 15). Curve C33 shows the FOM of the SNM of the memory cell of the present embodiment (FIG. 2). Curve C34 shows the FOM of the WM of the memory cell of the present embodiment (FIG. 2). In the simulation shown in FIG. 5, with respect to inverter circuits IVa, IVb, both the channel width and channel length of the p-type MOS transistors are 0.2 μm, and the channel width and channel length of the n-type MOS transistors are 0.37 μm and 0.12 μm. Also, with respect to n-type MOS transistors Qna and Qnb, the channel width is 0.2 μm and the channel length is 0.14 μm.

As can be seen from FIG. 5, as far as the FOM of SNM are concerned, while the values are in the range of 5–10 for the entire range of the power source voltage of the conventional memory cell (FIG. 15), in the memory cell of the present embodiment (FIG. 2), the values are in the range of 10–25, a significant improvement. When the SNM of the conventional memory cell is improved, the WM deteriorates significantly. On the other hand, when the WM is improved, the SNM deteriorates. That is, it is extremely difficult to improve one while keeping the other unchanged. This problem of the prior art is solved in the present embodiment.

Figure 6:
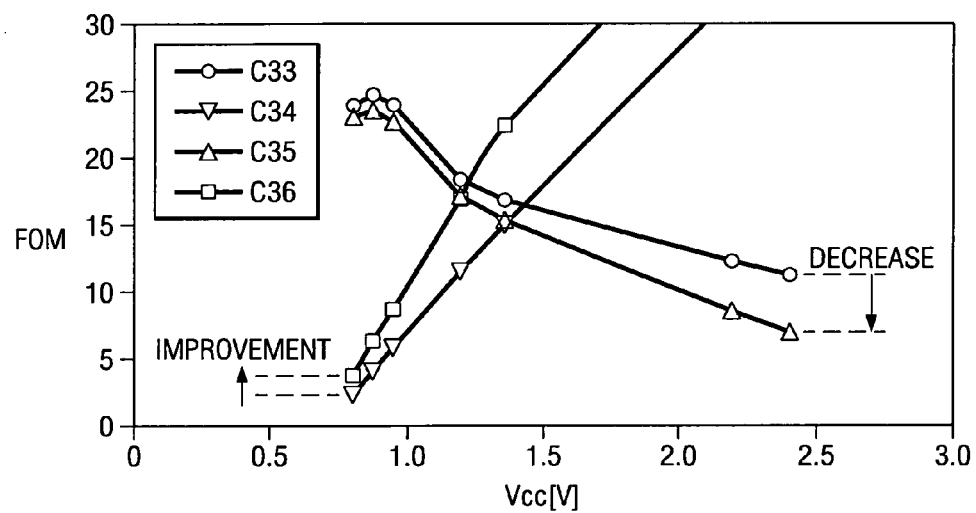
FIG. 6 is the second diagram illustrating the results of simulating the performance of the SNM and WM of the memory cell shown in FIG. 2.

On the other hand, FIG. 6 shows the results of simulation performed for the case when the channel width is increased from 0.2 μm to 0.37 μm for n-type MOS transistors Qna and Qnb, with the simulation performed in the same way as in FIG. 5. Curves C33 and C34 are the same curves as those in FIG. 5. Curves C35 and C36 show the FOM of SNM and WM when the channel is increased for n-type MOS transistors Qna and Qnb. As can be seen from FIG. 6, if the channel width of n-type MOS transistors Qna and Qnb is increased and the drivability is increased, the WM performance improves but the SNM performance drops slightly. However, as can be seen from FIG. 7, even if this reduction in SNM performance were to be subtracted, the SNM would still better than that of the conventional memory cell (FIG. 15).

Figure 7:
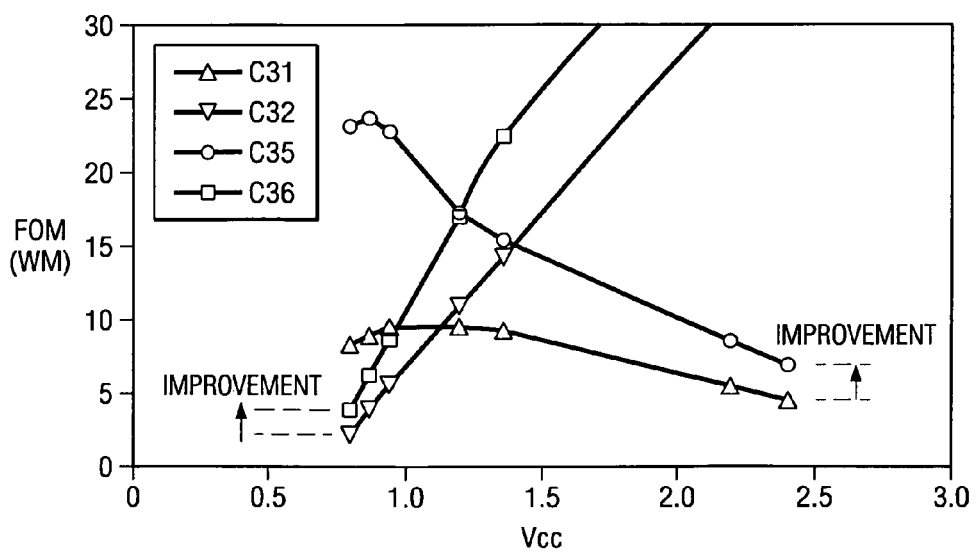
FIG. 7 is the third diagram illustrating the results of simulating the performance of the SNM and WM of the memory cell shown in FIG. 2.

FIG. 7 is a diagram illustrating the results of simulation of the conventional memory cell shown in FIG. 5 (curves C31, C32) plotted together with the results of simulation after changing the channel width in FIG. 6 (curves C35, C36). As can be seen from this figure, for the memory cell of the present embodiment, by adjusting the size of n-type MOS transistors Qna and Qnb appropriately, it is possible to improve the SNM and WM at the same time.

Embodiment 2

Embodiment 2 of the present invention will be explained below.

FIG. 8 is a diagram illustrating an example of the constitution of the SRAM device in Embodiment 2 of the present invention. The SRAM device shown in FIG. 8 has main array 11, write controller 21, read controller 22, column selecting circuits 31-1 to 31-n, 32-1 to 32-n, input circuits 41-1 to 41-n, and output circuits 42-1 to 42-n. Write controller 21 is an embodiment of the first controller of the present invention. Read controller 22 is an embodiment of the second controller of the present invention. Memory array 11 also has plural memory cells arranged in an array like memory array 10. Of these plural memory cells, the memory cells arranged side by side in the same row are connected to the common write word line WWL and read word line pair RWL, XRWL, and at the same time, the memory cells arranged side by side in the same column are connected to the common write bit line pair WBL, XWBL and read bit line RBL. Write controller 21 enables one word line WWL of plural write word lines WWL of memory array 11 correspondingly selected by write address signal AD1. Also, one column selecting line MXa of plural column selecting lines MXa (to be explained below) correspondingly selected by write address signal AD1 is enabled. Various control signals are generated for writing data to the memory cells corresponding to the enabled signal lines.

Column selecting circuits 31-1 to 31-n are circuits for selecting one of k columns of memory cells as the write object. That is, column selecting circuits 31-1 to 31-n are connected to k common column selecting lines MXa, and, at the same time, are connected to k groups of write bit line pairs WBL, XWBL. Since one of k column selecting lines MXa is enabled by means of controller 21, one group of write bit line pair WBL, XWBL corresponding to said enabled column selecting line MXa is selected from k groups. Then, by means of input circuits 41-1 to 41-n, the write signal is amplified, and the result is output to the selected bit line pair WBL, XWBL.

Input circuits 41-1 to 41-n amplify the write signal input from the external terminal and output the amplified signal to column selecting circuits 31-1 to 31-n. Read controller 22 enables one word line pair RWL, XRWL selected corresponding to read address signal AD2 from the plural read word line pairs RWL, XRWL of memory array 11. Also, one column selecting line MXb is selected from plural column selecting lines MXb (to be explained below) and enabled corresponding to read address AD2. Various control signals for reading data from the memory cells corresponding to said enabled signal lines are generated.

Column selecting circuits 32-1 to 32-n are circuits that select one of k columns of memory cells as the read object. That is, column selecting circuits 31-1 to 31-n are connected to k common column selecting lines MXb, and at the same time, are connected to k groups of read bit lines RBL. Since one of k column selecting lines MXb is enabled by means of controller 22, one group of read bit lines RBL corresponding to said enabled column selecting line MXb is selected from k groups. Then, the read signal of said selected bit line RBL is amplified, and the result is output to output circuits 42-1 to 42-n.

Output circuits 42-1 to 42-n amplify the read signal output from column selecting circuits 31-1 to 32-n and output the amplified signal to the external terminals.

The detailed constitution of the memory cell contained in memory array 11 will be explained below with reference to FIG. 9.

FIG. 9 is a diagram illustrating an example of the constitution of the memory cell pertaining to the present embodiment and contained in memory array 11. The memory cell shown in FIG. 9 has the same constitution as the memory cell shown in FIG. 2, and it contains n-type MOS transistors Qn11–Qn15 and p-type MOS transistors Qp11–Qp13, as well as n-type MOS transistors Qn16, Qn17 and p-type MOS transistors Qp14, Qp15. The circuit containing n-type MOS transistors Qn16, Qn17 and p-type MOS transistors Qp14, Qp15 forms an embodiment of the read circuit of the present invention. N-type MOS transistor Qn16 and p-type MOS transistor Qp14 form inverter circuit IV13. N-type MOS transistor Qn16 is connected between read bit line RBL and ground G, and p-type MOS transistor Qp14 is connected between power source line Vcc and read bit line RBL. The gates of these transistors are connected to node N11. N-type MOS transistor Qn17 is connected between inverter circuit IV13 and ground G, and p-type MOS transistor Qp15 is connected between inverter circuit IV13 and power source line Vcc. The gate of n-type MOS transistor Qn17 is connected to read word line RWL, and the gate of p-type MOS transistor Qp15 is connected to read word line XRWL. Said n-type MOS transistor Qn17 and p-type MOS transistor Qp15 are both turned on or off corresponding to the complementary signals input to read word line pair RWL, XRWL.

The connection relationship of n-type MOS transistors Qn11–Qn15 and p-type MOS transistors Qp11–Qp13 is the same as that of the memory cell shown in FIG. 2. However, word line WL, bit line pair BL, XBL, and level control line LL in the memory cell shown in FIG. 2 are here replaced with word line WWL, write bit line pair WBL, XWBL and column selecting line MXa, respectively, as shown in FIG. 9.

The operation of the SRAM device of the present embodiment with the aforementioned constitution will be explained below. Said SRAM device is a so-called 2-port SRAM device that allows parallel writing data and reading data.

Data Write Mode

When a data write is performed, write controller 21 enables one write word line WWL and one column selecting line MXa corresponding to write address signal AD1. When write word line WWL is enabled, it goes to the high level, and when column selecting line MXa is enabled, it goes to the low level. As a result, in the memory cell as the write object, column selecting line MXa goes to the low level, so that p-type MOS transistor Qp13 is turned on. Then, the high level voltage applied to write word line WWL is input via said turned-on p-type MOS transistor Qp13 to the gates of n-type MOS transistors Qn11 and Qn12. When the high level voltage becomes equal to the power source voltage, the gates of n-type MOS transistors Qn11 and Qn12 are at a voltage nearly equal to the power source voltage. As a result, n-type MOS transistors Qn11 and Qn12 are turned on, and memory node pair N10, N11 and write bit line pair WBL, XWBL are connected to each other.

In this case, after the write signals input through input circuits 41-1 to 42-n are amplified and converted to complementary signals by column selecting circuits 31-1 to 31-n, they are output to the write bit line pair WBL, XWBL of the column corresponding to enabled column selecting line MXa. As a result, the memory cell as the write object holds the stored data corresponding to the input write signal.

On the other hand, with respect to the memory cell that is not a write object with write word line WWL set to the high level and column selecting line MXa set to the high level, because p-type MOS transistor Qp13 is off, the high level signal fed to write word line WWL is input through n-type MOS transistor Qn15 to n-type MOS transistors Qn11 and Qn12. Consequently, the voltage of the gates of n-type MOS transistors Qn11 and Qn12 is less than that of said memory cell as the write object by the voltage corresponding the threshold voltage of n-type MOS transistor Qn15, and drivability of said transistors decreases.

In this case, write bit line pair WBL, XWBL that is not the write object is precharged to the high level under control of write controller 21. Consequently, at memory node pair N10, N11 of the memory cell as the write object, the high level voltage is applied via n-type MOS transistors Qn11 and Qn12. However, as explained above, because the drivability of n-type MOS transistors Qn11 and Qn12 is reduced, the current flowing from bit line pair WBL, XWBL to memory node pair N10, N11 is less, and the risk of inversion of the stored data is also reduced.

Data Read Mode

When a data read is performed, read controller 22 enables one read word line pair RWL, XRWL and one column selecting line MXb corresponding to read address signal AD2. When read word line pair RWL, XRWL is enabled, read word line RWL goes to the high level, and read word line XRWL goes to the low level. As a result, in the memory cell with read word line pair RWL, XRWL enabled, both n-type MOS transistor Qn17 and p-type MOS transistor Qp15 are turned on, and inverter circuit IV13 is in operation. As a result, a NOT signal of said node N11 of the memory cell is output to read bit line RBL. Of the read signals output from read bit lines RBL, the read signals of the column corresponding to column selecting line MXb are selected and amplified by column selecting circuits 32-1 to 32-n and output via input circuits 42-1 to 42-n to the outside.

As explained above, with respect to the SRAM device of the present embodiment, in the memory cell in the same row as the memory cell as the write object but that is not selected as the write object by said selection signal, the level of the signal input to the gates of the transistor pair Qn11, Qn12 is subject to level conversion so that it is decreased by a voltage corresponding to the threshold voltage of the transistors, and the drivability of transistor pair Qn11, Qn12 decreases. Consequently, when it is necessary to turn transistor pair Qn11, Qn12 on while holding the stored data, it is possible to lower the drivability of transistor pair Qn11, Qn12 and to increase the SNM. When rewriting the stored data, it is possible to increase the drivability of transistor pair Qn11, Qn12 and to increase the WM. As a result, it is possible to improve the performance of both the SNM and WM, and it is possible to improve the reliability of the device. Also, it has the same effects as Embodiment 1 with respect to the following points: by driving both sides of memory node pair N10, N11 with complementary signals, it is possible to increase the writability, and, by inserting level conversion circuit LS between word line WWL and the gates of transistor pair Qn11, Qn12, it is possible to have noise immunity.

Simulation Result 2

The results of analysis of simulation of the performance of the memory cell WM shown in FIG. 9 and the memory cell shown in FIG. 16 will be explained below.

Figure 16:
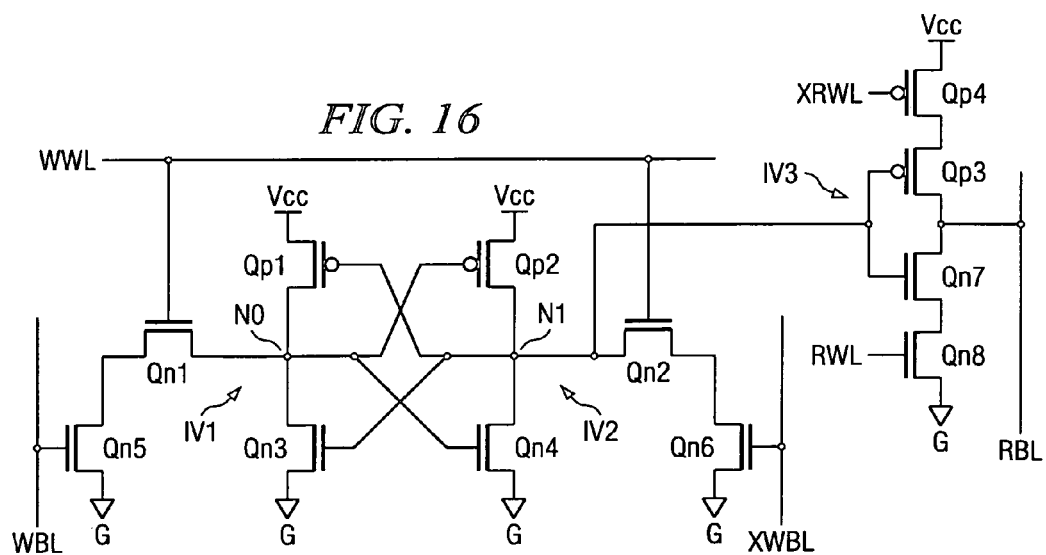
FIG. 16 is a diagram illustrating an example of the constitution of the memory cell in 2-port type SRAM.
Figure 17A:
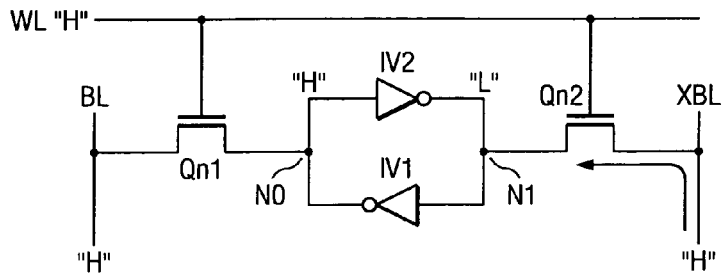
FIG. 17 is a diagram illustrating the operation in the case when the stored data is damaged in the memory cell shown in FIG. 15.
Figure 17B:
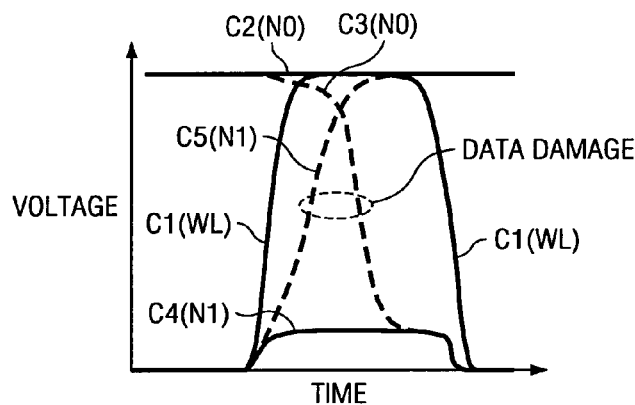
Figure 18A:
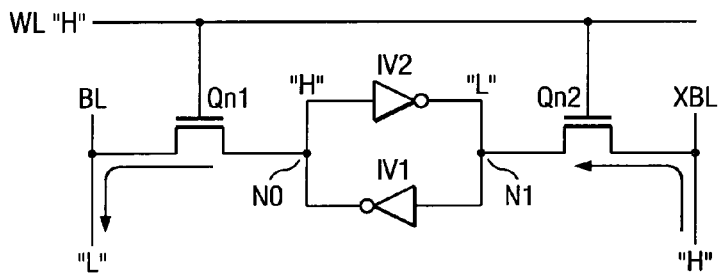
FIG. 18 is a diagram illustrating a failure to rewrite data in the memory cell shown in FIG. 15.
Figure 18B:
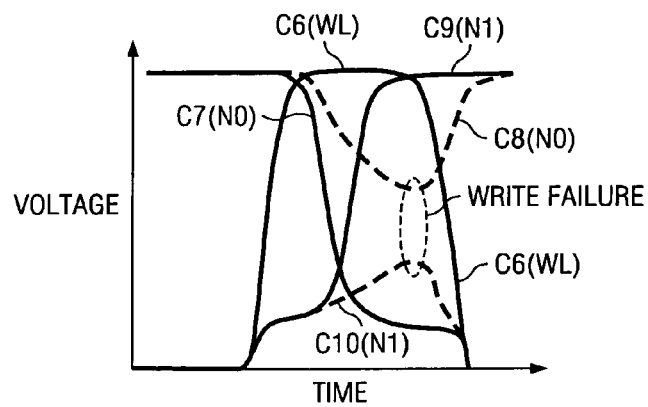

FIG. 10 is a diagram illustrating the circuit for simulating the performance of the WM for the memory cell of the prior art shown in FIG. 16. In FIG. 10, n-type MOS transistors Qna, Qnb, Qnd, Qne and inverter circuits IVa, IVb correspond to n-type MOS transistors Qn1, Qn2, Qn5, Qn6 and inverter circuits IV1, IV2 shown in FIG. 16, respectively. Read circuit Qn7, Qn8, Qp3, Qp4 is not shown in FIG. 16. As shown in FIG. 10, in the initial state, the output of inverter circuit IVa is set to the high level, and the output of inverter circuit IVb is set to the low level. Also, voltage V that changes from low to high level is applied to the gate of n-type MOS transistor Qnd, and voltage V that changes from high to low level is applied to the gate of n-type MOS transistor Qne.

In this circuit, like the circuit shown in FIG. 4(B), by finding the point between the voltages of nodes N0 and N1 at which they are equal while changing voltage V, said voltage Vtrip_WM can be obtained. The circuit for simulating the memory cell shown in FIG. 9 is the same as the circuit shown in FIG. 4(B), except that it has read circuit (the circuit corresponding to Qn16, Qn17, Qp14, Qp15).

FIG. 11 shows the results computed for the FOM of WM under plural power source voltages for the memory cells shown in FIGS. 16 and 9. The abscissa represents the power source voltage and the ordinate the FOM value. Curve C37 shows the FOM of the WM of the memory cell of the prior art (FIG. 16). Curve C38 shows the FOM of the WM of the memory cell of the present embodiment (FIG. 9). As can be seen from FIG. 11, the memory cell of the present embodiment (FIG. 9) has an FOM value about 2–5 larger than that of the memory cell of the prior art (FIG. 16). Consequently, the performance of the WM is improved relative to that of the prior art.

Embodiment 3

Embodiment 3 will be explained below.

Figure 12:
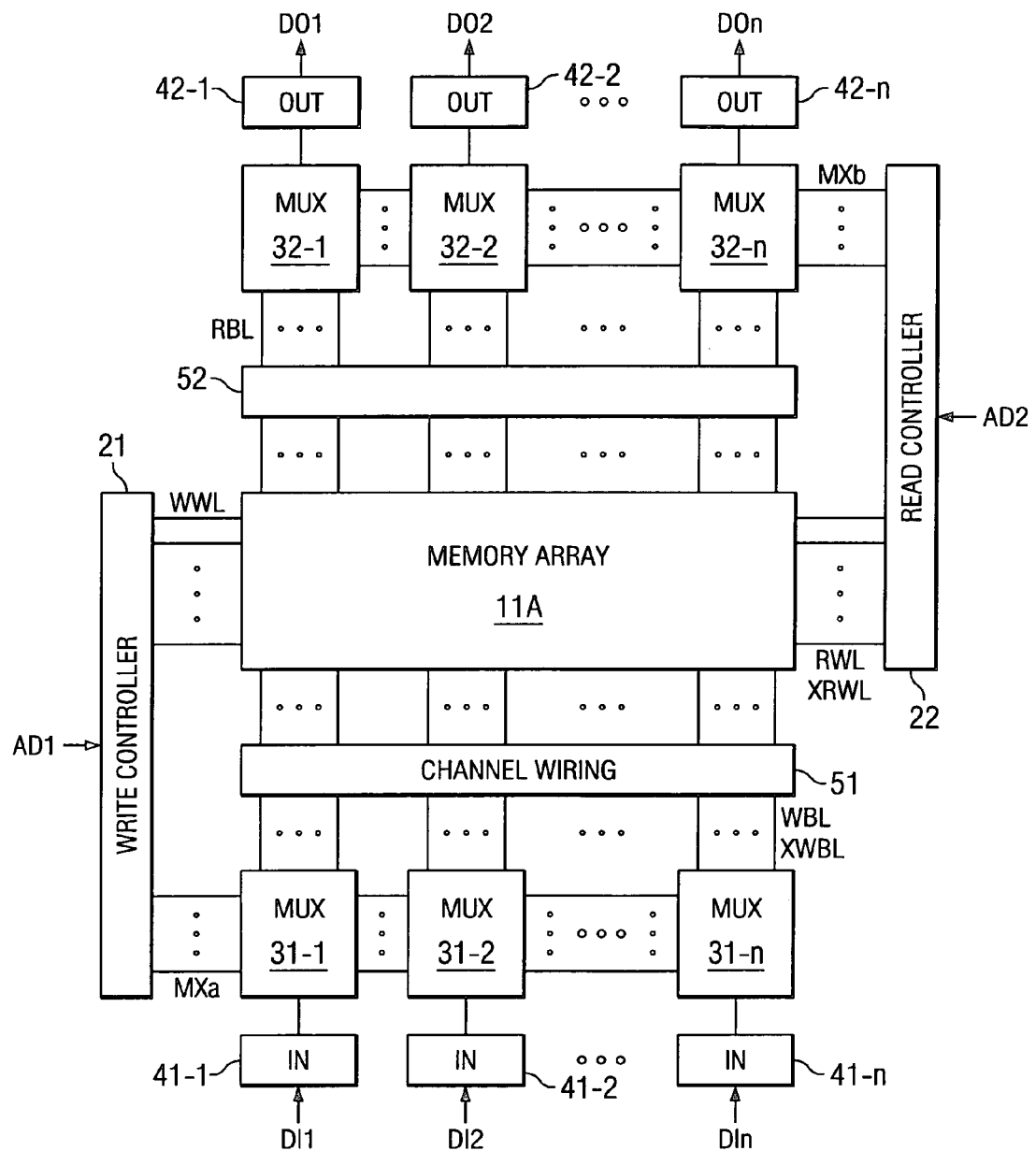
FIG. 12 is a diagram illustrating an example of the constitution of the SRAM device pertaining to Embodiment 3.

FIG. 12 is a diagram illustrating an example of the constitution of the SRAM device pertaining to Embodiment 3. For the SRAM device shown in FIG. 12, memory array 11 in the SRAM device shown in FIG. 8 is replaced with memory array 11A (to be explained below), and at the same time, channel wiring portions 51 and 52 are arranged between memory array 11A and column selecting circuits 31-1 to 31-n, 32-1 to 32-n.

Figure 13:
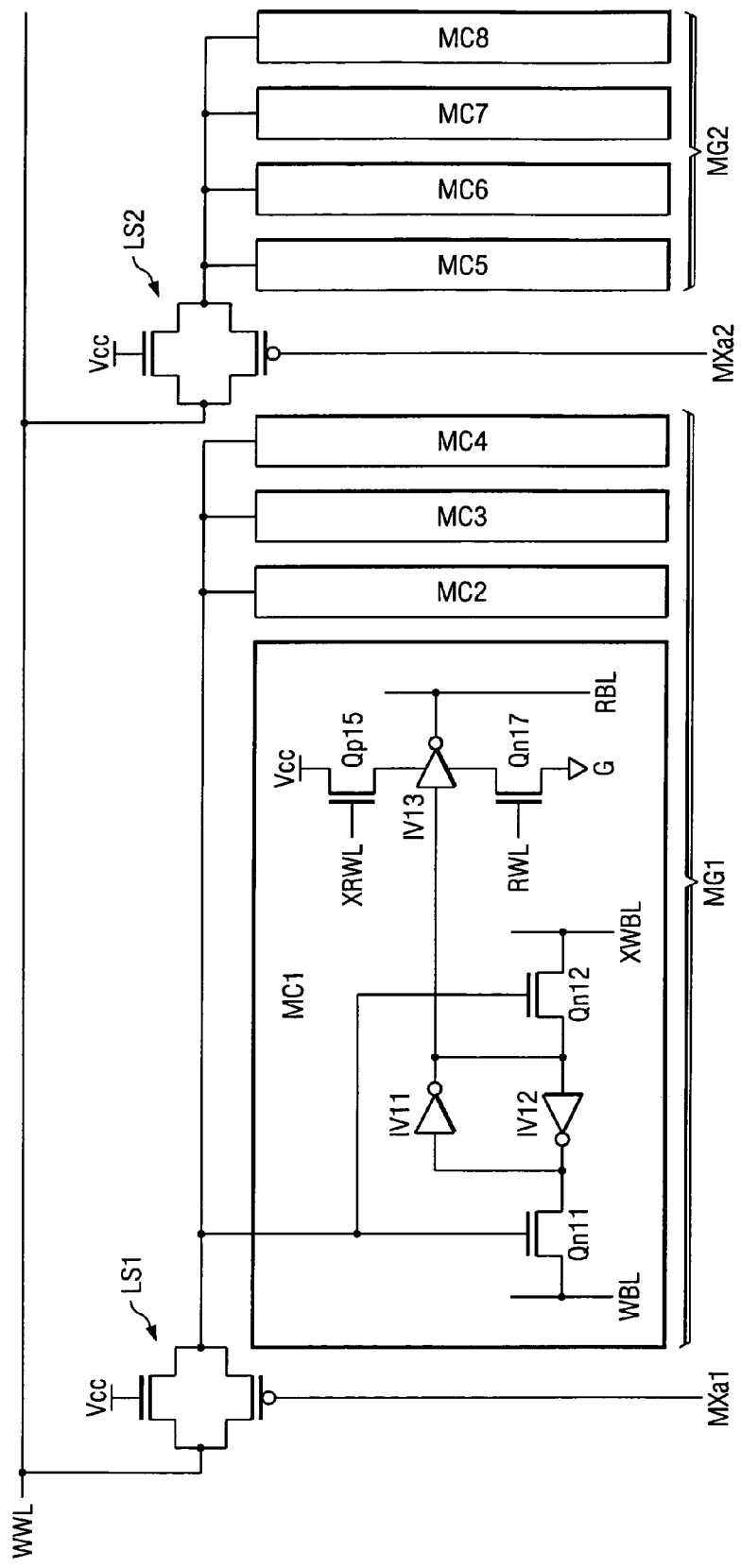
FIG. 13 is a diagram illustrating an example of the constitution of the memory cell and level conversion circuit in Embodiment 3.

FIG. 13 is a diagram illustrating an example of the constitution of memory cells MC1, MC2, . . . and level conversion circuits LS1, LS2, . . . contained in said memory array 11A. As shown in FIG. 13, memory cells MC1, MC2, . . . have the same constitution as that of the memory cell shown in FIG. 9 excluding level conversion circuit LS (that is, Qn11, Qn12, Qn17, Qp15, IV11–IV13). Although not shown in the figure, the constitution is the same as said memory array 11 with respect to the connection of write bit line pair WBL, XWBL, read word line pair RWL, XRWL and read bit line RBL to memory cells MC1, MC2, . . . .

The plural columns of memory array 11A are categorized into groups each having adjacent 4 columns. The memory cells of the same row contained in the columns of the same group (such as MC1–MC4 and MC5–MC8) form the respective group of the memory cells (memory cell groups MG1, MG2, . . . ). These groups of columns correspond to one of the four write column selecting lines MXa1–MXa4 and one of the four respective read column selecting lines MXb1–MXb4. When write column selecting circuits 31-1 to 31-4 enable any of write column selecting lines MXa1–MXa4, the column group corresponding to the enabled column selecting line is selected as the write object. As a result, the input data that are input via input circuits 41-1 to 41-n are written to the memory group belonging to the selected column group. Also, when read column selecting circuits 32-1 to 32-4 enable any of the column selecting lines MXb1 to MXb4, the column group corresponding to the enabled column selecting line is selected as the read object. As a result, from the memory cell group belonging to the selected column group, the stored data are read and output from output circuits 41-1 to 42-n.

Level conversion circuits LS1, LS2, . . . are arranged corresponding to said memory cell groups MG1, MG2, . . . and are connected to the connecting lines between corresponding memory cell groups and the respective write word lines WWL. Level conversion circuits LS1, LS2, . . . have parallel connected n-type MOS transistors and p-type MOS transistors, like level conversion circuit LS shown in FIG. 9. The gates of n-type MOS transistors are connected to power source line Vcc, and the gates of p-type MOS transistors are connected to column selecting lines MXa1–MXa4. The column selecting lines connected to the gates of the p-type MOS transistors are column selecting lines that are enabled when the corresponding memory cell group is selected as the write object.

Figure 14:
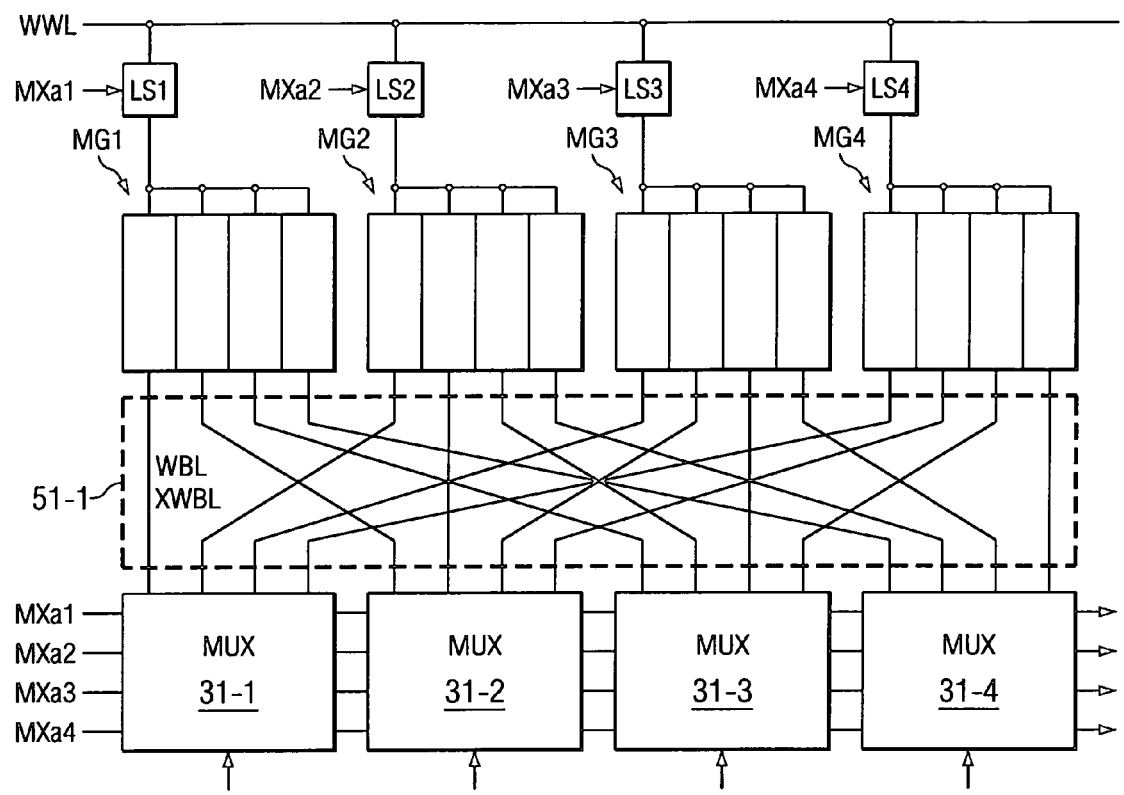
FIG. 14 is a diagram illustrating an example of the wiring in the channel wiring port.

FIG. 14 is a diagram illustrating an example of a portion 51-1 of channel wiring portion 51. As explained above, when any of the write column selecting lines MXa1–MXa4 and read column selecting lines MXb1–MXb4 are enabled, the column group (including four adjacent columns) corresponding to the enabled column selecting line becomes the access object at the same time. On the other hand, it is necessary to have the bit lines (or bit line pairs) of the columns as the access object connected to the respective column selecting circuits. This is because only one column can be selected at a time from each column selecting circuit. Consequently, the adjacent 4 columns of bit lines (or bit line pairs) must be connected to different column selecting circuits, and intersections are formed between the bit line wiring.

FIG. 14 is a diagram illustrating an example of wiring between memory array 11A and column selecting circuits 41-1 to 41-4. Channel wiring portion 51 is a wiring portion where write bit line pairs WBL, XWBL cross between memory array 11A and column selecting circuits 31-1 to 31-n as shown in FIG. 14. Also, channel wiring portion 52 is the wiring portion where read bit lines RBL cross between memory array 11A and column selecting circuits 32-1 to 32-n.

The write operation of the SRAM device having the aforementioned constitution and shown in FIG. 12 will be explained below. Also, as the read operation is the same as the SRAM device shown in FIG. 8, the explanation will not be repeated.

Data Write Mode

By means of write controller 21, when one of write word lines WL and one of column selecting lines MXa are enabled corresponding to write address signal AD1, the plural memory cell groups that belong to the column group corresponding to said enabled column selecting line MXa and that belong to the row connected to enabled write word line WL are selected as the write object. Also, in level conversion circuits LS1, LS2, . . . corresponding to the plural memory cell groups, column selection signal MXa connected to the p-type MOS transistor is enabled. When write word line WWL is enabled, it goes to the high level, and when column selecting line MXa is enabled, it goes to the low level. Consequently, said p-type MOS transistor is turned on. As a result, the high level voltage of write word line WWL is input to the memory cell group as the write object without a voltage drop due to level conversion circuits LS1, LS2, . . . .

On the other hand, with respect to the memory cell group that is not the write object with write word line WWL at the high level and with column selecting line MXa at the high level, the p-type MOS transistors of the corresponding level conversion circuits LS1, LS2, . . . are turned off. As a result, the high level voltage of write word line WWL is input to the memory cell group that is not the write object without a voltage drop due to level conversion circuits LS1, LS2, . . . .

Consequently, in the SRAM device of the present embodiment, when it is necessary to hold the stored data while the transistor pair Qn11, Qn12 are turned on (when not the write object), it is possible to decrease the drivability of the transistor pair Qn11, Qn12 to improve SNM and to increase the drivability of transistor pair Qn11, Qn12 and thus improve the WM. As a result, it is possible to improve the performance of both SNM and WM, and to improve the reliability of the device.

Also, in the SRAM device in the present embodiment, it is possible to design one level conversion circuit for four memory cells. Consequently, it is possible to reduce the circuit scale compared with the SRAM device shown in FIG. 8.

Three embodiments of the present invention were explained above. However, the present invention is not limited to these embodiments and various modifications can be performed. The circuit constitutions in said embodiments are merely examples and may be modified and replaced with other circuits having the same function as desired. For example, in the aforementioned examples, the level conversion circuit is a parallel connected n-type MOS transistor and p-type MOS transistor. However, the present invention is not limited to this constitution. For example, plural n-type MOS transistors can be connected in parallel with one n-type MOS transistor. As a result, it is possible to increase the voltage drop when the p-type MOS transistor is off. Also, one may set the threshold voltage of n-type MOS transistor as a threshold voltage different from that of transistor pair Qn11, Qn12. As a result, it is possible to make fine adjustment for the voltage drop when the p-type MOS transistor is off, and it is possible to appropriately control the drivability of transistor pair Qn11, Qn12. Also, the level conversion circuit may be made up of p-type MOS transistors only or n-type MOS transistors only, and the prescribed potential difference can be obtained by controlling the gate voltage. Also, in said embodiment, n-type MOS transistors and p-type MOS transistors are used. However, the present invention is not limited to this scheme. For example, one may also use bipolar transistors and other elements.

The numbers of elements in said embodiments are merely examples, and the present invention is not limited thereto. For example, memory array 11A shown in FIG. 13 has one level conversion circuit for every four memory cells. However, the present invention in not limited in this way. Level conversion circuits may be formed with other ratios.

The invention claimed is:

1. A static memory cell comprising:
   a memory circuit having a node pair;
   a transistor pair connected between said node pair and a bit line pair; and
   a level conversion circuit connected between a word line and the gates of said transistor pair, wherein said level conversion circuit selectively provides either a first control signal or a lower drivability signal to said gates.

2. The static memory cell of claim 1 wherein said level conversion circuit comprises:
   a switch circuit that turns on/off corresponding to a level control signal; and
   a transistor circuit connected in parallel with said switch circuit so that when said switch circuit is off, a level of said first control signal input to one terminal of said switch circuit is changed by a prescribed threshold level to create said lower drivability signal and output from the other terminal of said switch circuit.

3. The static memory cell of claim 2 wherein:
   said transistor pair contains a transistor of the first conductivity type,
   said switch circuit contains a transistor of the second conductivity type,
   and that said transistor circuit contains a transistor of the first conductivity type connected in parallel with the transistor of the second conductivity type of said switch circuit.

4. The static memory cell of claim 3 wherein said transistor of the transistor circuit has a threshold level different from that of the transistor of the first conductivity type of said transistor pair.

5. The static memory cell of claim 3 wherein the transistor circuit includes plural transistors of the first conductivity type connected in series.

6. The static memory cell of claim 1 further comprising a read circuit that outputs a read signal to a second bit line corresponding to a signal held at least on one node of said memory node pair corresponding to a second control signal.

7. An SRAM device comprising:
   plural memory cells arranged in an array,
   plural word lines each connected to memory cells of the same row,
   plural bit line pairs each connected to the memory cells of the same column,
   and a controller that outputs a control signal to said word line for accessing said memory cell, and, at the same time, generates a level control signal for controlling the level of said control signal input to said memory cell;
   wherein said memory cells comprise
   a memory circuit that holds the signal levels of said memory node pair at complementary levels and inverts the signal levels of said memory node pair corresponding to the complementary signals input through said bit line pair,
   a transistor pair that is connected between said bit line pair and said memory node pair and is turned on/off corresponding to the level of said control signal input through said word line,
   and a level conversion circuit that changes the level of said control signal input to said transistor pair to the level with a lower drivability of said transistor pair.

8. The SRAM device of claim 7 wherein said controller generates said level control signal by executing said level conversion for said control signal input to the memory cells not as a write object and contained in the same row as the memory cell as the write object and/or all of the memory cells contained in the same row as the memory cell as the write object.

9. The SRAM device of claim 7 wherein said level conversion circuit comprises:
   a switch circuit that is turned on/off corresponding to said level control signal,
   and a transistor circuit that is connected in parallel to said switch circuit and, when said switch circuit is off, changes the level of said control signal input to one terminal of said switch circuit by a prescribed threshold level, and outputs it from the other terminal of said switch circuit.

10. An SRAM device comprising:
    plural memory cells arranged in an array
    plural first word lines each connected to the memory cells in the same row,
    plural second word lines each connected to the memory cells in the same row,
    plural first bit line pairs each connected to the memory cells in the same column,
    plural second bit lines each connected to the memory cells in the same column;
    a first controller that outputs a first control signal to said first word line for writing data to said memory cell, and at the same time, generates a selection signal for selecting the memory cell of the write object from the memory cells connected to the same word line,
    and a second controller that outputs a second control signal to said second word line for reading data from said memory cell;
    wherein said memory cell comprises the following parts:
    a memory circuit that holds the signal level of the memory node pair at complementary levels and inverts the signal levels of said memory node pair corresponding to the complementary signals input through said first bit line pair,
    a transistor pair that is connected between said first bit line pair and said memory node pair and is turned on/off corresponding to the level of said first control signal input through said first word line,
    a read circuit that outputs a read signal, which corresponds to the signal of at least one node of said memory node pair, to said second bit line corresponding to the second control signal input through said second word line,
    and a level conversion circuit that changes the level of the first control signal input to said transistor pair to a level with lower drivability of the transistor pair when not selected as the write object by said selection signal.

11. An SRAM device comprising:
    plural memory cells arranged in an array,
    plural first word lines each connected to the memory cells in the same row,
    plural second word lines each connected to the memory cells in the same row,
    plural first bit line pairs each connected to the memory cells in the same column,
    plural second bit lines each connected to the memory cells in the same column;
    a first controller that outputs a first control signal to said first word line for writing data in said memory cell, and at the same time, generates a selection signal for selecting the memory cell of the write object from the memory cells connected to the same word line, plural level conversion circuits corresponding to the plural memory cell groups that can become write objects by means of said selection signal, and a second controller that outputs the second control signal to said second word line for reading data from said memory cell;

wherein said memory cell comprises the following parts:

a memory circuit that holds the signal levels of the memory node pair at complementary levels and inverts the signal levels of said memory node pair corresponding to the complementary signals input through said first bit line pair, a transistor pair that is connected between said first bit line pair and said memory node pair and is turned on/off corresponding to the level of said first control signal input through said first word line, and a read circuit that outputs a read signal, which corresponds to the signal of at least one node of said memory node pair, to said second bit line corresponding to the second control signal input through said second word line;

and said level conversion circuit changes the level of the first control signal input to said transistor pair of the corresponding memory cell group to a level with lower drivability for said transistor pair when said corresponding memory cell group is not selected as the write object by said selection signal.

12. The SRAM device of claim 11 wherein said level conversion circuit comprises:

a switch circuit that is turned on/off corresponding to said selection signal, and a transistor circuit, which is connected in parallel with said switch circuit and which changes the level of said first control signal input to one terminal of said switch circuit by a prescribed threshold level and outputs it from the other terminal of said switch circuit when said switch circuit is off.

13. An SRAM device comprising:

a first node, a second node, a memory element that is connected between said first node and said second node and is used to hold signals that are the complements of said first node and said second node, a first switching element connected between the bit line and said first node, a second switching element connected between the complementary bit line and said second node, and a voltage supply circuit, which is connected between the word line and the control terminal of said first switching element as well as the control terminal of said second switching element, and which supplies a signal corresponding to the signal supplied to said word line corresponding to the input selection signal;

the drivability of said first switching element and second switching element when said selection signal is on is higher than the drivability of said first switching element and second switching element when said selection signal is off.

14. The SRAM device of claim 13 further comprising a read circuit, which is connected between the read bit line and said second node, and which is controlled by the signal of the read word line.

15. The SRAM device of claim 13 wherein said memory element comprises:

a first inverter element with its input terminal connected to said second node and with its output terminal connected to said first node, and a second inverter element with its input terminal connected to said first node and with its output terminal connected to said second node.

16. The SRAM device of claim 15 wherein said first switching element and second switching element are MOS transistors.

17. The SRAM device of claim 16 wherein said voltage supply circuit contains a MOS transistor with said selection signal applied to its gate terminal.

18. The SRAM device of claim 16 wherein said voltage supply circuit comprises an nMOS transistor and a pMOS transistor connected between said word line and the gate terminals of said first switching element and second switching element, and said selection signal is supplied to the gate terminal of said pMOS transistor.

19. The SRAM device of claim 14 wherein said read circuit has an inverter element connected between said second node and said read bit line.

20. The SRAM device of claim 13 wherein said selection signal is supplied corresponding to the column selection signal for selecting the bit line pair composed of said bit line and complementary bit line.

* * * * *